United States Patent
Karasawa et al.

(10) Patent No.: US 11,199,775 B2
(45) Date of Patent: Dec. 14, 2021

(54) RESIST UNDERLAYER FILM-FORMING COMPOSITION CONTAINING NAPHTHOL ARALKYL RESIN

(71) Applicant: NISSAN CHEMICAL CORPORATION, Tokyo (JP)

(72) Inventors: Ryo Karasawa, Toyama (JP); Keisuke Hashimoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/094,609

(22) PCT Filed: Apr. 17, 2017

(86) PCT No.: PCT/JP2017/015490
§ 371 (c)(1),
(2) Date: Oct. 18, 2018

(87) PCT Pub. No.: WO2017/183612
PCT Pub. Date: Oct. 26, 2017

(65) Prior Publication Data
US 2019/0302616 A1    Oct. 3, 2019

(30) Foreign Application Priority Data
Apr. 18, 2016   (JP) .............................. JP2016-082985

(51) Int. Cl.
| | | |
|---|---|---|
| *G03F 7/031* | (2006.01) | |
| *G03F 7/11* | (2006.01) | |
| *G03F 7/16* | (2006.01) | |
| *G03F 7/20* | (2006.01) | |
| *H01L 21/027* | (2006.01) | |
| *H01L 21/266* | (2006.01) | |
| *H01L 21/308* | (2006.01) | |
| *G03F 7/038* | (2006.01) | |
| *G03F 7/26* | (2006.01) | |

(52) U.S. Cl.
CPC .............. *G03F 7/0381* (2013.01); *G03F 7/11* (2013.01); *G03F 7/168* (2013.01); *G03F 7/20* (2013.01); *G03F 7/2059* (2013.01); *G03F 7/26* (2013.01); *H01L 21/027* (2013.01); *H01L 21/0274* (2013.01); *H01L 21/266* (2013.01); *H01L 21/3081* (2013.01); *H01L 21/3086* (2013.01)

(58) Field of Classification Search
CPC . G03F 7/031; G03F 7/11; G03F 7/168; G03F 7/2059; H01L 21/0274; H01L 21/266; H01L 21/3086; H01L 21/3081
See application file for complete search history.

(56) References Cited

U.S. PATENT DOCUMENTS

2006/0251990 A1* 11/2006 Uh ..................... G03F 7/091
                                                                430/270.1
2010/0021830 A1*  1/2010 Kim ................... G03F 7/091
                                                                430/5
2015/0004531 A1   1/2015 Choi et al.
(Continued)

FOREIGN PATENT DOCUMENTS

| JP | 2003-345027 A | 12/2003 |
|---|---|---|
| JP | 2010-524224 A | 7/2010 |
| JP | 2015-018223 A | 1/2015 |

(Continued)

OTHER PUBLICATIONS

Jul. 4, 2017 Search Report issued in International Patent Application No. PCT/JP2017/015490.
(Continued)

*Primary Examiner* — Catherine S Branch
(74) *Attorney, Agent, or Firm* — Oliff PLC

(57) ABSTRACT

A resist underlayer film not undergoing intermixing with a resist layer, having high dry etching and heat resistance, exhibiting high temperature low mass loss, and exhibiting even stepped substrate coatability, includes a polymer containing a unit structure of the formula (1):

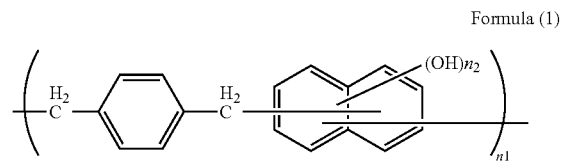

Formula (1)

The unit structure of formula (1) is a unit structure of the formula (2):

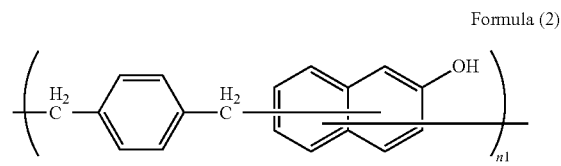

Formula (2)

A method for producing a semiconductor device, includes forming, on a semiconductor substrate, a resist underlayer film using a resist underlayer film-forming composition, forming a hard mask on the resist underlayer film, a resist film on the hard mask, a resist pattern by irradiation with light or an electron beam and development of the resist film, a pattern by etching the hard mask using the resist pattern, a pattern by etching the underlayer film using the patterned hard mask, and processing the substrate using the patterned resist underlayer film.

10 Claims, No Drawings

(56) References Cited

U.S. PATENT DOCUMENTS

2016/0126088 A1    5/2016  Kim et al.

FOREIGN PATENT DOCUMENTS

| WO | 2006/132088 A1 | 12/2006 |
| WO | 2011/074494 A1 | 6/2011 |
| WO | 2012/077640 A1 | 6/2012 |
| WO | 2014/185335 A1 | 11/2014 |

OTHER PUBLICATIONS

Jul. 4, 2017 Written Opinion issued in International Patent Application No. PCT/JP2017/015490.

* cited by examiner

RESIST UNDERLAYER FILM-FORMING COMPOSITION CONTAINING NAPHTHOL ARALKYL RESIN

TECHNICAL FIELD

The present invention relates to a resist underlayer film-forming composition using a naphthol aralkyl resin.

BACKGROUND ART

In production of a semiconductor device, micro-processing by lithography using a photoresist composition is conventionally performed. The micro-processing is a processing method in which a thin film of a photoresist composition is formed on a substrate to be processed such as a silicon wafer, the thin film is irradiated with active light such as ultraviolet through a mask pattern disposed thereon and corresponding to a pattern of a semiconductor device, the resultant is developed, and the substrate to be processed such as a silicon wafer is etched using the obtained photoresist pattern as a protective film. In recent years, however, semiconductor devices have been highly integrated, and the wavelength of the active light to be employed tends to be shortened from KrF excimer laser (248 nm) to ArF excimer laser (193 nm). In accordance with this, diffuse reflection of the active light from the substrate and the influence of standing waves cause a serious problem. Therefore, a method in which an anti-reflective coating is provided between a photoresist and a substrate to be processed has been widely examined.

When a resist pattern is further refined in the future, a problem of resolution or a problem of a resist pattern collapse after development may occur, and hence a resist is desired to be reduced in thickness. Therefore, it is difficult to obtain a sufficient resist pattern thickness in processing the substrate, and a process for imparting a function to work as a mask in substrate processing to not only a resist pattern but also a resist underlayer film formed between a resist and a semiconductor substrate to be processed has been necessary. As the resist underlayer film to be used in such a process, differently from a conventional resist underlayer film having a high etch rate (rapidly etched), there is a demand for a resist underlayer film for lithography having a selection ratio of dry etching rate close to that of a resist, a resist underlayer film for lithography having a smaller selection ratio of dry etching rate than a resist, or a resist underlayer film for lithography having a smaller selection ratio of dry etching rate than a semiconductor substrate.

For example, a coating type underlayer film-forming composition for lithography containing a naphthalene resin derivative is known (see, Patent Document 1, Patent Document 2, Patent Document 3 and Patent Document 4).

PRIOR ART DOCUMENTS

Patent Documents

Patent Document 1: International Publication No. WO2006/132088
Patent Document 2: Japanese Patent Application Publication No. 2003-345027
Patent Document 3: International Publication No. WO2011/074494
Patent Document 4: International Publication No. WO2012/077640

SUMMARY OF THE INVENTION

Problems to be Solved by the Invention

An object of the present invention is to provide a resist underlayer film-forming composition containing a naphthol aralkyl resin to be used in a lithography process in production of a semiconductor device. Another object of the present invention is to provide a resist underlayer film for lithography that does not undergo intermixing with a resist layer, has high dry etching resistance, has high heat resistance, exhibits low mass loss at a high temperature, and exhibits even coatability of a stepped substrate, and a resist underlayer film-forming composition to be used for forming the underlayer film. Besides, the present invention can impart, to the resist underlayer film, an ability to effectively absorb reflected light from the substrate when irradiation light is used in micro-processing. Still another object of the present invention is to provide a method for forming a resist pattern using a resist underlayer film-forming composition.

Means for Solving the Problem

The present invention provides the following: In a first aspect, a resist underlayer film-forming composition, comprising a polymer containing a unit structure of the following formula (1):

Formula (1)

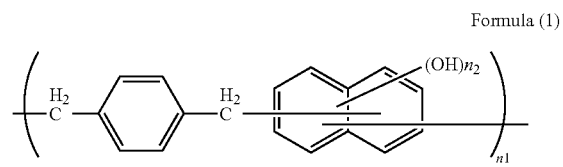

wherein n1 is the number of repetitions of the unit structure and is an integer of 1 to 10, and n2 is an integer of 1 or 2;

in a second aspect, the resist underlayer film-forming composition according to the first aspect, in which the unit structure of formula (1) is a unit structure of the following formula (2):

Formula (2)

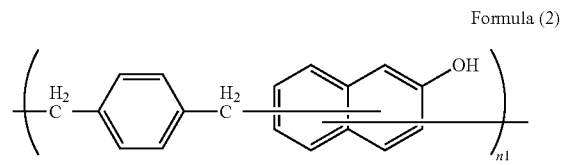

wherein n1 is the number of repetitions of the unit structure and is an integer of 1 to 10;

in a third aspect, the resist underlayer film-forming composition according to the first aspect or the second aspect, further comprising a crosslinking agent;

in a fourth aspect, the resist underlayer film-forming composition according to any one of the first to third aspects, further comprising an acid and/or an acid generator;

in a fifth aspect, a method for producing a resist underlayer film, comprising coating a semiconductor substrate with the resist underlayer film-forming composition according to any one of the first to fourth aspects, and baking the resultant;

in a sixth aspect, a method for producing a semiconductor device, comprising a step of forming, on a semiconductor substrate, a resist underlayer film using the resist underlayer film-forming composition according to any one of the first to fourth aspects, a step of forming a resist film on the resist underlayer film, a step of forming a resist pattern by irradiation with light or an electron beam and development of the resist film, a step of etching the resist underlayer film using the resist pattern, and a step of processing the semiconductor substrate using the patterned resist underlayer film;

in a seventh aspect, a method for producing a semiconductor device, comprising a step of forming, on a semiconductor substrate, a resist underlayer film using the resist underlayer film-forming composition according to any one of the first to fourth aspects, a step of forming a hard mask on the resist underlayer film, a step of forming a resist film on the hard mask, a step of forming a resist pattern by irradiation with light or an electron beam and development of the resist film, a step of etching the hard mask using the resist pattern, a step of etching the resist underlayer film using the patterned hard mask, and a step of processing the semiconductor substrate using the patterned resist underlayer film;

in an eighth aspect, the production method according to the sixth or seventh aspect, in which the processing of the semiconductor substrate is etching of the semiconductor substrate or ion implantation into the semiconductor substrate; and in a ninth aspect, the production method according to the sixth or seventh aspect, in which the processing of the semiconductor substrate is ion implantation of a component containing boron, arsenic, phosphorus or a combination thereof into the semiconductor substrate.

Effects of the Invention

According to a resist underlayer film-forming composition of the present invention, a resist underlayer film for lithography that does not undergo intermixing between an upper layer portion of the resist underlayer film and a layer covering the upper layer portion, has high dry etching resistance, has high heat resistance, exhibits low mass loss at a high temperature, and exhibits even coatability of a stepped substrate can be provided. Thus, a resist formed on the resist underlayer film can be formed with a good resist pattern shape without causing pattern collapse or the like.

The resist underlayer film-forming composition of the present invention can be imparted with an ability to effectively absorb reflection from a substrate, and an effect as an anti-reflective coating for exposure light can be also obtained.

Owing to the resist underlayer film-forming composition of the present invention, an excellent resist underlayer film having a selection ratio of dry etching rate close to that of a resist, having a smaller selection ratio of dry etching rate than the resist or having a smaller selection ratio of dry etching rate than a semiconductor substrate can be provided.

A resist is reduced in thickness for preventing resist pattern collapse after development due to refinement of the resist pattern. Such a thin resist is used in a process in which a resist pattern is transferred to an underlayer film by an etching process and a substrate is processed using the underlayer film as a mask, or a process in which a step of transferring a resist pattern onto an underlayer film by an etching process, and further transferring, onto an underlayer film, the pattern transferred to the underlayer film using a different gas composition is repeated and a substrate is ultimately processed. The resist underlayer film and the film-forming composition of the present invention are effective in such a process, and when the resist underlayer film is used for processing a substrate, sufficient etching resistance against the substrate to be processed (for example, a thermally oxidized silicon film, a silicon nitride film, a polysilicon film or the like on the substrate) is obtained.

Besides, the resist underlayer film of the present invention can be used as a planarizing film, a resist underlayer film, a contamination prevention film for a resist layer, or a film having dry etch selectivity. Thus, a resist pattern can be easily and accurately formed in a lithography process in production of a semiconductor.

In a process, a resist underlayer film of the resist underlayer film-forming composition of the present invention is formed on a substrate, a hard mask is formed on the resist underlayer film, a resist film is formed on the hard mask, a resist pattern is formed by exposure and development of the resist film, the resist pattern is transferred to the hard mask, the transferred resist pattern to the hard mask is transferred to the resist underlayer film, and the resultant resist underlayer film is used for processing the semiconductor substrate. In this process, the hard mask is formed from a coating type composition containing an organic polymer or an inorganic polymer and a solvent in some cases, and is formed by vacuum deposition of an inorganic substance in other cases. In the vacuum deposition of the inorganic substance (such as silicon oxynitride), a deposit is deposited on the surface of the resist underlayer film, and at this point, the surface temperature of the resist underlayer film increases up to about 400° C.

Besides, in a step of performing ion implantation of a component containing boron, arsenic, phosphorus, or a combination of any of these, the resist underlayer film can work as a mask for protecting a surface of a silicon substrate.

MODES FOR CARRYING OUT THE INVENTION

The present invention provides a resist underlayer film-forming composition comprising a polymer containing a unit structure of formula (1).

In formula (1), n1 is the number of repetitions of the unit structure, and is an integer of 1 to 10, 2 to 10, or 3 to 10, and n2 is an integer of 1 or 2.

In the present invention, the composition contains the polymer and a solvent. Besides, the composition can contain a crosslinking agent and an acid, and can contain an additive such as an acid generator or a surfactant if necessary. A solid content of the composition is 0.1 to 70% by mass, or 0.1 to 60% by mass. The solid content corresponds to a content ratio of all components of the resist underlayer film-forming composition excluding the solvent. The solid content can contain 1 to 100% by mass, 1 to 99.9% by mass, or 50 to 99.9% by mass of the polymer.

The polymer used in the present invention has a weight average molecular weight of 600 to 1000000, or 600 to 200000.

Examples of the unit structure of formula (1) contained in the polymer include unit structures of formula (2) to formula (4), and the unit structure of formula (2) is preferred.

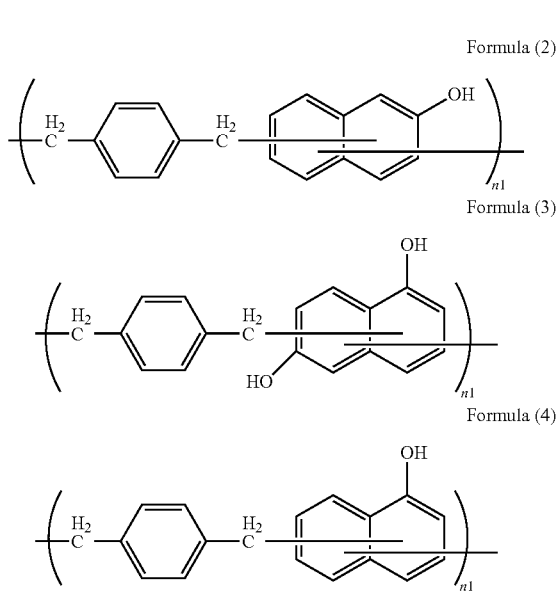

Formula (2)

Formula (3)

Formula (4)

In formula (2) to formula (4), n1 is the number of repetitions of the unit structure, and is an integer of 1 to 10, 2 to 10, or 3 to 10.

The naphthol aralkyl resin described above can be obtained, for example, by reacting naphthol and p-xylylene glycol dimethyl ether in the presence of a catalyst. As the catalyst, an acidic catalyst such as methanesulfonic acid or oxalic acid can be used. Alternatively, as the naphthol aralkyl resin, a commercially available resin of, for example, trade names SN-180, SN-395, SN-485, SN-495V and the like manufactured by Nippon Steel & Sumikin Chemical Co., Ltd. can be used.

The resist underlayer film-forming composition of the present invention can be obtained by mixing an additional polymer with the above-described polymer in an amount of 30% by mass or less based on a mass of all the polymers.

Examples of the additional polymer include a polyacrylic acid ester compound, a polymethacrylic acid ester compound, a polyacrylamide compound, a polymethacrylamide compound, a polyvinyl compound, a polystyrene compound, a polymaleimide compound, a polymaleic anhydride, and a polyacrylonitrile compound.

The resist underlayer film-forming composition of the present invention can contain a crosslinking agent component. Examples of the crosslinking agent include a melamine-based compound, a substituted urea-based compound, and polymers of these. A crosslinking agent having at least two crosslink-forming substituents is preferred, and examples include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea. Alternatively, a condensate of such a compound can be used.

Besides, as the crosslinking agent, a crosslinking agent having high heat resistance can be used. As the crosslinking agent having high heat resistance, a compound containing a crosslink-forming substituent having an aromatic ring (such as a benzene ring or a naphthalene ring) in a molecule can be preferably used.

Examples of the compound include a compound having a partial structure of the following formula (5) and a polymer or an oligomer having a repeating unit of the following formula (6).

In formula (5), $R^{11}$ and $R^{12}$ each is a hydrogen atom, a $C_{1-10}$ alkyl group, or a $C_{6-20}$ aryl group, n11 is an integer of 1 to 4, n12 is an integer of 1 to (5−n11), and (n11+n12) is an integer of 2 to 5.

In formula (4), $R^{13}$ is a hydrogen atom or a $C_{1-10}$ alkyl group, $R^{14}$ is a $C_{1-10}$ alkyl group, n13 is an integer of 1 to 4, n14 is 0 to (4−n13), and (n13+n14) is an integer of 1 to 4. An oligomer or a polymer having the number of repetitions of the unit structure of 2 to 100 or 2 to 50 can be used.

Examples of these alkyl groups and aryl groups include the alkyl groups and aryl groups described above.

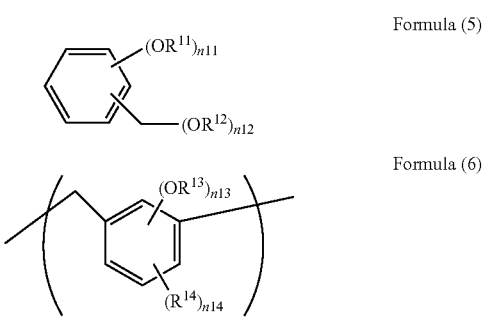

Formula (5)

Formula (6)

Examples of the compound, the polymer and the oligomer of formula (5) and formula (6) include the following:

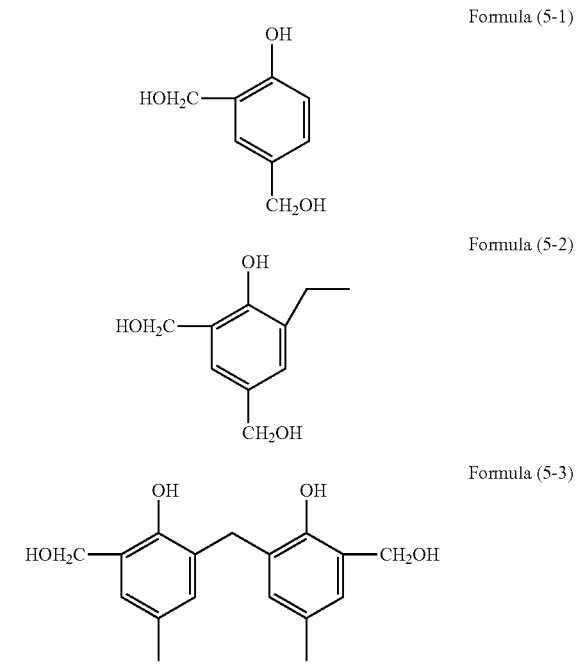

Formula (5-1)

Formula (5-2)

Formula (5-3)

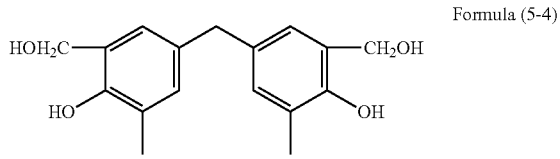

Formula (5-4)

Formula (5-5)
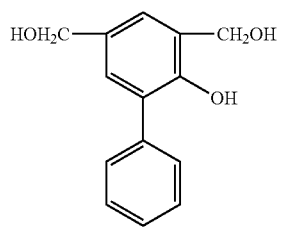
Formula (5-6)
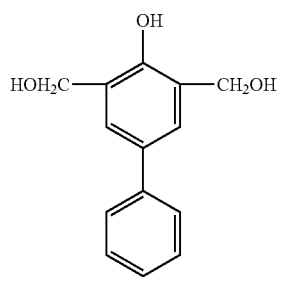
Formula (5-7)
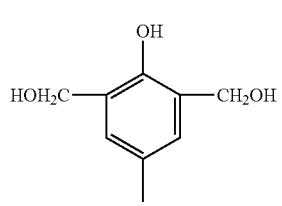
Formula (5-8)
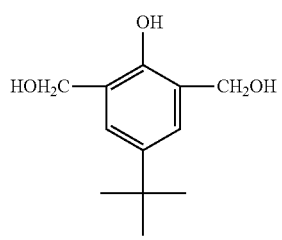
Formula (5-9)
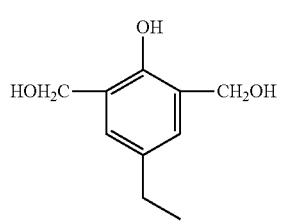
Formula (5-10)
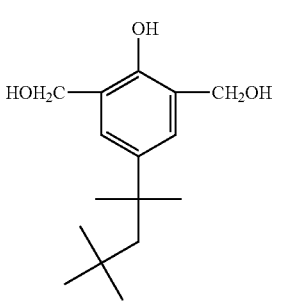
Formula (5-11)
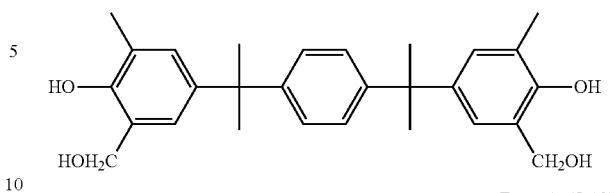
Formula (5-12)
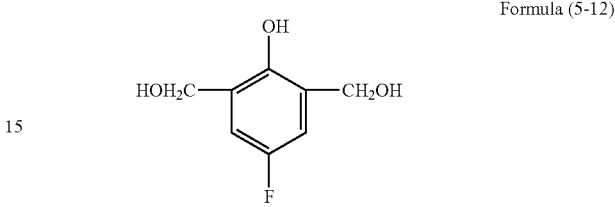
Formula (5-13)
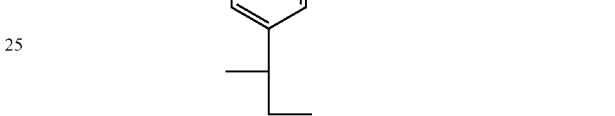
Formula (5-14)
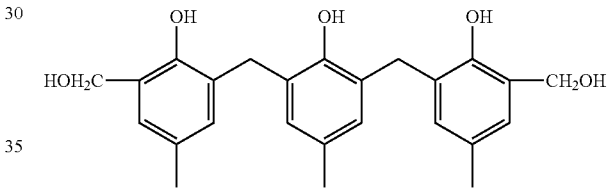
Formula (5-15)
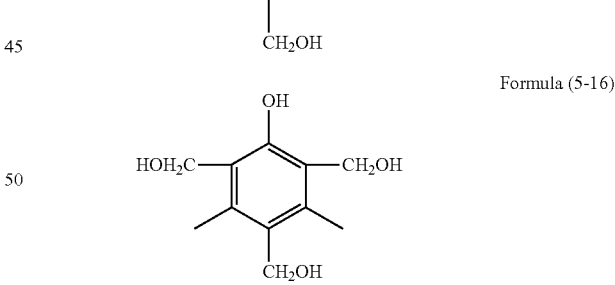
Formula (5-16)
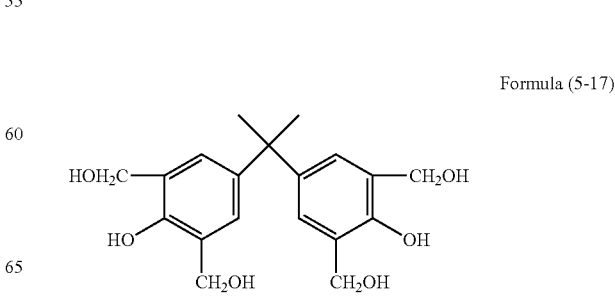
Formula (5-17)

Formula (5-18)
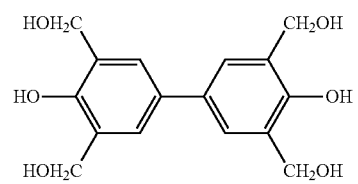

Formula (5-19)
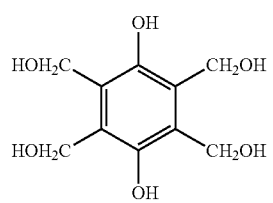

Formula (5-20)
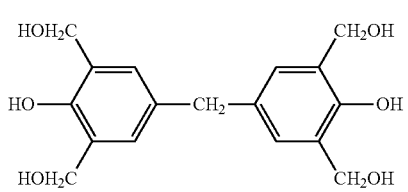

Formula (5-21)
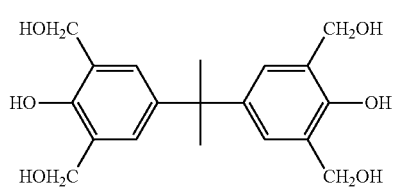

Formula (5-22)
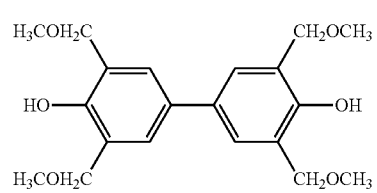

Formula (5-23)
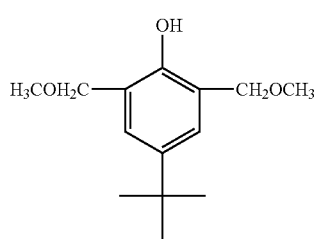

Formula (5-24)
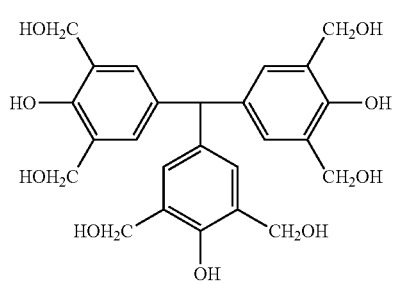

Formula (5-25)
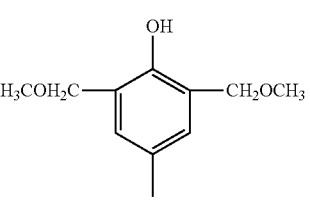

Formula (5-26)
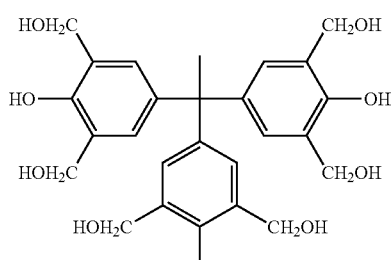

Formula (5-27)
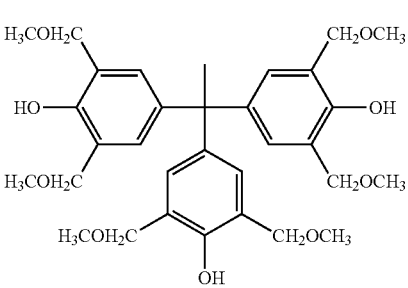

The above-described compounds are available as products of Asahi Organic Chemicals Industry Co., Ltd. and Honshu Chemical Industry Co., Ltd. For example, among the above-described crosslinking agents, a compound of formula (5-21) is available under trade name TM-BIP-A from Asahi Organic Chemicals Industry Co., Ltd.

A content of the crosslinking agent is varied depending on a coating solvent to be used, an underlying substrate to be used, a desired solution viscosity, a desired film shape and the like, and is 0.001 to 80% by mass, preferably 0.01 to 50% by mass, and further preferably 0.05 to 40% by mass with respect to the total solid content. In such a crosslinking agent, a crosslinking reaction may occur through self-condensation, but when a crosslinking substituent is present in the polymer of the present invention, the crosslinking reaction can be caused with the crosslinking substituent.

In the present invention, as the catalyst for promoting the crosslinking reaction, an acidic compound, such as p-toluenesulfonic acid, trifluoromethanesulfonic acid, pyridinium p-toluenesulfonic acid, salicylic acid, sulfosalicylic acid, citric acid, benzoic acid, hydroxybenzoic acid or naphthalenecarboxylic acid, or/and a thermal acid generator such as 2,4,4,6-tetrabromocyclohexadienone, benzoin tosylate, 2-nitrobenzyl tosylate or another organic sulfonic acid alkyl ester can be contained. The content is 0.0001 to 20% by mass, preferably 0.0005 to 10% by mass, and preferably 0.01 to 3% by mass with respect to the total solid content.

To the resist underlayer film-forming composition for lithography of the present invention, a photo-acid generator can be added in order to match the acidity of the resist underlayer film to that of a photoresist covering the upper layer of the resist film in a lithography step. Examples of a preferable photo-acid generator include onium salt-based photo-acid generators such as bis(4-t-butylphenyl)iodonium trifluoromethanesulfonate and triphenylsulfonium trifluoromethanesulfonate, halogen-containing compound-based photo-acid generators such as phenyl-bis(trichloromethyl)-s-triazine, and sulfonate-based photo-acid generators such as benzoin tosylate and N-hydroxysuccinimide trifluoromethanesulfonate. A content of the photo-acid generator is 0.2 to 10% by mass, and preferably 0.4 to 5% by mass with respect to the total solid content.

To the resist underlayer film-forming composition for lithography of the present invention, an additional light absorber, a rheology adjusting agent, an adhesive aid, a surfactant or the like can be added if necessary in addition to the above-described components.

As the additional light absorber, for example, commercially available light absorbers described in "Kogyoyo Shikiso no Gijutsu to Shijo (Technology and Market of Industrial Pigments)" (CMC Publishing Co., Ltd.) and "Senryo Binran (Dye Handbook)" (edited by Society of Synthetic Organic Chemistry), such as C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.I. Fluorescent Brightening Agent 112, 135 and 163; C.I. Solvent Orange 2 and 45; C.I. Solvent Red 1, 3, 8, 23, 24, 25, 27 and 49; C.I. Pigment Green 10; and C.I. Pigment Brown 2, can be suitably used. The light absorber is contained usually in a range of 10% by mass or less, and preferably 5% by mass or less with respect to the total solid content of the resist underlayer film-forming composition for lithography.

The rheology adjusting agent is added mainly for purposes of improving flowability of the resist underlayer film-forming composition so as to improve, particularly in a baking step, film thickness uniformity of the resist underlayer film and a filling property of the resist underlayer film-forming composition in a hole of a substrate or the like. Specific examples include phthalic acid derivatives such as dimethyl phthalate, diethyl phthalate, diisobutyl phthalate, dihexyl phthalate and butylisodecyl phthalate, adipic acid derivatives such as di-normal butyl adipate, diisobutyl adipate, diisooctyl adipate and octyldecyl adipate, maleic acid derivatives such as di-normal butyl maleate, diethyl maleate and dinonyl maleate, oleic acid derivatives such as methyl oleate, butyl oleate and tetrahydrofurfuryl oleate, or stearic acid derivatives such as normal butyl stearate and glyceryl stearate. Such a rheology adjusting agent is contained usually in a ratio of less than 30% by mass with respect to the total solid content of the resist underlayer film-forming composition for lithography.

The adhesive aid is added mainly for purposes of improving adhesiveness between the substrate or the resist and the resist underlayer film formed from the resist underlayer film-forming composition so as to prevent the resist from peeling off particularly in the development. Specific examples include chlorosilanes such as trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine, and urea or thiourea compounds such as 1,1-dimethylurea and 1,3-dimethylurea. Such an adhesive aid is contained usually in a ratio less than 5% by mass, and preferably less than 2% by mass with respect to the total solid content of the resist underlayer film-forming composition for lithography.

The resist underlayer film-forming composition for lithography of the present invention may contain a surfactant in order to prevent formation of a pinhole and a striation, and to further improve a coating property against surface irregularities. Examples of the surfactant include nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-based surfactants such as EFTOP EF301, EF303 and EF352 (manufactured by Tochem Products Co., Ltd., trade names), MEGAFACE F171, F173, R-30, R-40 and R-40N (manufactured by DIC Corporation, trade names), FLUORAD FC430 and FC431 (manufactured by Sumitomo 3M Limited, trade names), and Asahi Guard AG710, Surflon S-382, SC101, SC102, SC103, SC104, SC105 and SC106 (manufactured by Asahi Glass Co., Ltd., trade names); and organo-siloxane polymer KP341 (manufactured by Shin-Etsu Chemical Co., Ltd.). A content of such a surfactant is usually 2.0% by mass or less, and preferably 1.0% by mass or less with respect to the total solid content of the resist underlayer film-forming composition for lithography of the present invention. One of these surfactants may be singly added, or a combination of two or more of these can be added.

In the present invention, as the solvent for dissolving the polymer, the crosslinking agent component, the crosslinking catalyst or the like, the following can be used: ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate and butyl lactate. One of these organic solvents is singly used, or two or more of these are used in combination.

Alternatively, a mixture of high boiling point solvents such as propylene glycol monobutyl ether and propylene glycol monobutyl ether acetate can be used. Among these solvents, propylene glycol monomethyl ether, propylene glycol monomethyl ether acetate, ethyl lactate, butyl lactate and cyclohexane are preferred from the viewpoint of improvement of a leveling property.

Next, a method for forming a resist pattern of the present invention will be described: a substrate used in production of a precision integrated circuit element (e.g., a transparent substrate such as a silicon/silicon dioxide covered substrate, a glass substrate or an ITO substrate) is coated on the resist underlayer film-forming composition by an appropriate coating method using a spinner, a coater or the like, and the resultant is cured by baking to form a coating type underlayer film. Here, the thickness of the resist underlayer film is preferably 0.01 to 3.0 µm. Besides, the baking after the coating is performed under conditions of 80 to 350° C. for 0.5 to 120 minutes. Thereafter, the resist underlayer film is coated with a resist directly or after one or several layers of a coating material are formed on the coating type underlayer film if necessary, and light or electron beam irradiation is performed through a prescribed mask, followed by development, rinsing and drying, and thus, a good resist pattern can be obtained. Post exposure bake (PEB) after the light or electron beam irradiation can be performed if necessary. Then, a portion of the resist underlayer film corresponding to a portion of the resist removed through the development in the above-described step is removed by dry etching, and thus, a desired pattern can be formed on the substrate.

The resist used in the present invention is a photoresist or an electron beam resist.

As the photoresist with which the upper portion of the resist underlayer film for lithography of the present invention is coated, either of a negative resist and a positive resist can be used, and examples include a positive photoresist containing a novolac resin and 1,2-naphthoquinonediazide sulfonic acid ester, a chemically amplified photoresist containing a binder having a group decomposed by an acid to increase an alkali dissolution rate and a photo-acid generator, a chemically amplified photoresist containing an alkali-soluble binder, a low molecular weight compound decomposed by an acid to increase the alkali dissolution rate of the photoresist and a photo-acid generator, a chemically amplified photoresist containing a binder having a group decomposed by an acid to increase the alkali dissolution rate, a low molecular weight compound decomposed by an acid to increase the alkali dissolution rate of the photoresist and a photo-acid generator, and a photoresist having a Si atom in a skeleton, and another example includes trade name APEX-E, manufactured by Rohm & Haas.

Examples of the electron beam resist with which the upper portion of the resist underlayer film for lithography of the present invention is coated include a composition containing a resin having a Si—Si bond in a main chain and an aromatic ring at an end and an acid generator generating an acid through electron beam irradiation, and a composition containing poly(p-hydroxystyrene) in which a hydroxyl group is substituted with an organic group including N-carboxyamine and an acid generator generating an acid through electron beam irradiation. In using the latter electron beam resist composition, the acid generated from the acid generator through the electron beam irradiation reacts with a N-carboxyaminoxy group present in a polymer side chain, the polymer side chain is decomposed to a hydroxy group to be alkali soluble and hence is dissolved in an alkaline developer, resulting in forming a resist pattern. Examples of such an acid generator generating an acid through the electron beam irradiation include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane and 2-chloro-6-(trichloromethyl)pyridine, onium salts such as triphenylsulfonium salt and diphenyliodonium salt, and sulfonic acid esters such as nitrobenzyl tosylate and dinitrobenzyl tosylate.

The resist solution after coating is baked at a baking temperature of 70 to 150° C. for baking time of 0.5 to 5 minutes, and a resist film thickness in a range of 10 to 1000 nm can be obtained. The covering with the resist solution, a developer, or a coating material described below can performed by spin coating, a dipping method, a spray method or the like, and a spin coating method is particularly preferred. Exposure of the resist is performed through a prescribed mask. For the exposure, KrF excimer laser (of a wavelength of 248 nm), ArF excimer laser (of a wavelength of 193 nm), EUV light (of a wavelength of 13.5 nm), an electron beam or the like can be used. After the exposure, the post exposure bake (PEB) can be performed if necessary. Conditions for the post exposure bake are appropriately selected from a heating temperature of 70° C. to 150° C. and heating time of 0.3 to 10 minutes.

As the developer for the resist including the resist underlayer film formed by using the resist underlayer film-forming composition for lithography of the present invention, an aqueous solution of any of the following alkalis can be used: Inorganic alkalis such as sodium hydroxide, potassium hydroxide, sodium carbonate, sodium silicate, sodium metasilicate and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide and choline, and cyclic amines such as pyrrole and piperidine. Besides, alcohols such as isopropyl alcohol, a nonionic surfactant or the like may be added in an appropriate amount to the aqueous solution of the alkalis. Among these developers, quaternary ammonium salts are preferred, and tetramethylammonium hydroxide and choline are further preferred.

Besides, in the present invention, an organic solvent can be used as the developer for developing the resist. After the exposure of the resist, the development is performed using the developer (the solvent). Thus, for example, when a positive photoresist is used, an unexposed portion of the photoresist is removed to form a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate. Besides, a surfactant or the like can be added to such a developer. Conditions for the development are appropriately selected from a temperature of 5 to 50° C. and time of 10 to 600 seconds.

In the present invention, a semiconductor device can be produced through a step of forming, on a semiconductor substrate, a resist underlayer film from a resist underlayer film-forming composition, a step of forming a resist film on the resist underlayer film, a step of forming a resist pattern by light or electron beam irradiation and development of the resist film, a step of etching the resist underlayer film using the resist pattern, and a step of processing the semiconductor substrate using the patterned resist underlayer film.

When a resist pattern is further refined in the future, there arises a problem of resolution or a problem of resist pattern collapse after development, and a resist is desired to be reduced in thickness. Therefore, it is difficult to obtain a sufficient resist pattern thickness in processing the substrate, and a process for imparting a function to work as a mask in substrate processing not only to a resist pattern but also to a resist underlayer film formed between a resist and a semiconductor substrate to be processed has become necessary. As the resist underlayer film to be used in such a process, differently from a conventional resist underlayer film having a high etch rate, there is a demand for a resist underlayer film for lithography having a selection ratio of dry etching rate close to that of a resist, a resist underlayer film for lithography having a smaller selection ratio of dry etching rate than a resist, or a resist underlayer film for lithography having a smaller selection ratio of dry etching rate than a semiconductor substrate. Besides, such a resist underlayer film can be imparted with an anti-reflective ability, and can also have a function of a conventional anti-reflective coating.

On the other hand, in order to obtain a fine resist pattern, a process in which a resist pattern and a resist underlayer film are formed, during dry etching the resist underlayer film, to be smaller than a pattern width obtained during development of a resist has been started to be employed. As a resist underlayer film to be employed in such a process, there is a demand for a resist underlayer film having a selection ratio of dry etching rate close to that of a resist differently from a conventional anti-reflective coating having a high etch rate. Besides, such a resist underlayer film can be imparted with an anti-reflective ability, and can also have a function of a conventional anti-reflective coating.

In the present invention, after forming the resist underlayer film of the present invention on the substrate, the resist underlayer film can be coated on a resist directly or after one or several layers of a coating material are formed on the resist underlayer film if necessary. Thus, the pattern width of the resist is narrowed, and even when the resist is applied in a small thickness for preventing pattern collapse, the substrate can be processed by appropriately selecting an etching gas.

Specifically, a semiconductor device can be produced through a step of forming, on a semiconductor substrate, a resist underlayer film from a resist underlayer film-forming composition, a step of forming, on the resist film, a hard mask of a coating material containing a silicon component or the like, or a hard mask (of, for example, silicon oxynitride) formed by deposition, a step of further forming a resist film on the hard mask, a step of forming a resist pattern by light or electron beam irradiation and development of the resist film, a step of forming a pattern by etching the hard mask with a halogen-based gas using the resist pattern, a step of forming a pattern by etching the resist underlayer film with an oxygen-based gas or a hydrogen-based gas using the patterned hard mask, and a step of processing the semiconductor substrate with a halogen-based gas using the patterned resist underlayer film.

In the present invention, processing of the semiconductor substrate can be performed by etching of the semiconductor substrate or ion implantation into the semiconductor substrate. When the processing of the semiconductor substrate is performed by the ion implantation of a component containing boron, arsenic, phosphorus or a combination thereof into the semiconductor substrate, the resist underlayer film is useful as a mask material for protecting the surface of the silicon substrate. An example of a component containing boron includes boron trifluoride, an example of a component containing phosphorus includes phosphine, and an example of a component containing arsenic includes arsine.

In consideration of the effect, as an anti-reflective coating, of the resist underlayer film formed from the resist underlayer film-forming composition for lithography of the present invention, since a light absorbing moiety is incorporated into the skeleton of the polymer, no substance is diffused into the photoresist during drying by heating, and in addition, since the light absorbing moiety has high light absorbing ability, an effect of preventing reflected light is high.

The resist underlayer film formed from the resist underlayer film-forming composition for lithography of the present invention has high thermal stability, can prevent contamination of an upper layer film during baking otherwise caused by a decomposed product, and can also provide allowance for a temperature margin in the baking step.

Besides, depending on process conditions to be employed, the resist underlayer film formed from the resist underlayer film-forming composition for lithography of the present invention can be used as a film that has both a function to prevent light reflection and a function to prevent interaction between a substrate and a photoresist, or to prevent harmful influence on the substrate of a material used in the photoresist or a substance generated during exposure of the photoresist.

EXAMPLES

Example 1

A solution was obtained by adding, to 5.0 g of a naphthol resin, trade name SN-180 (manufactured by NIPPON STEEL & SUMIKIN CHEMICAL CO., LTD., corresponding to formula (2), weight average molecular weight: 1400), 13.5 g of propylene glycol monomethyl ether acetate and 31.50 g of propylene glycol monomethyl ether. Thereafter, the obtained solution was filtered through a polyethylene microfilter having a pore size of 0.10 μm and further through a polyethylene microfilter having a pore size of 0.05 μm, and thus, a resist underlayer film-forming composition solution was prepared.

Example 2

A solution was obtained by adding, to 5.0 g of a naphthol resin, trade name SN-395 (manufactured by NIPPON STEEL & SUMIKIN CHEMICAL CO., LTD., corresponding to formula (3), weight average molecular weight: 1160), 13.5 g of propylene glycol monomethyl ether acetate and 31.50 g of propylene glycol monomethyl ether. Thereafter, the obtained solution was filtered through a polyethylene microfilter having a pore size of 0.10 μm and further through a polyethylene microfilter having a pore size of 0.05 μm, and thus, a resist underlayer film-forming composition solution was prepared.

Example 3

A solution was obtained by adding, to 5.0 g of a naphthol resin, trade name SN-485 (manufactured by NIPPON STEEL & SUMIKIN CHEMICAL CO., LTD., corresponding to formula (4), weight average molecular weight: 560), 13.5 g of propylene glycol monomethyl ether acetate and 31.50 g of propylene glycol monomethyl ether. Thereafter, the obtained solution was filtered through a polyethylene microfilter having a pore size of 0.10 μm and further through a polyethylene microfilter having a pore size of 0.05 μm, and thus, a resist underlayer film-forming composition solution was prepared.

Example 4

A solution was obtained by adding, to 5.0 g of a naphthol resin, trade name SN-495V (manufactured by NIPPON STEEL & SUMIKIN CHEMICAL CO., LTD., corresponding to formula (4), weight average molecular weight: 640), 13.5 g of propylene glycol monomethyl ether acetate and 31.50 g of propylene glycol monomethyl ether. Thereafter, the obtained solution was filtered through a polyethylene microfilter having a pore size of 0.10 μm and further through a polyethylene microfilter having a pore size of 0.05 μm, and thus, a resist underlayer film-forming composition solution was prepared.

Comparative Example 1

10.0 g of a naphthol resin, trade name SN-180 (manufactured by NIPPON STEEL & SUMIKIN CHEMICAL CO., LTD., corresponding to formula (2), weight average molecular weight: 1,400) was dissolved in 40.0 g of epichlorohydrin. To the resultant solution, 0.03 g of ethyltriphenylphosphonium bromide was further added, and after causing a reaction at 120° C. for 12 hours, 4.2 g of a 48% sodium hydroxide aqueous solution was added to the resultant in a dropwise manner over 5 minutes. After completing the dropwise addition, the reaction was further continued for 30 minutes. Thereafter, the thus generated salt was removed by filtration, the resultant was washed with water, and epichlorohydrin was distilled off to obtain an epoxy resin of formula (7). An epoxy equivalent thereof was 271 g/eq.

3.26 g of the epoxy resin of formula (7) was dissolved in 23.3 g of propylene glycol monomethyl ether acetate, 2.50 g of 9-anthracenecarboxylic acid and 0.25 g of ethyltriphenylphosphonium bromide were added to the resultant, the resultant was refluxed at 120° C. for 12 hours to perform a reaction, and thus, a solution of a polyether resin of formula (8) was obtained. The thus obtained polymer compound was subjected to GPC analysis, and was found to have a weight average molecular weight of 1,800 in terms of standard polystyrene.

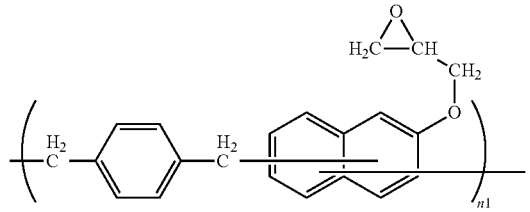

Formula (7)

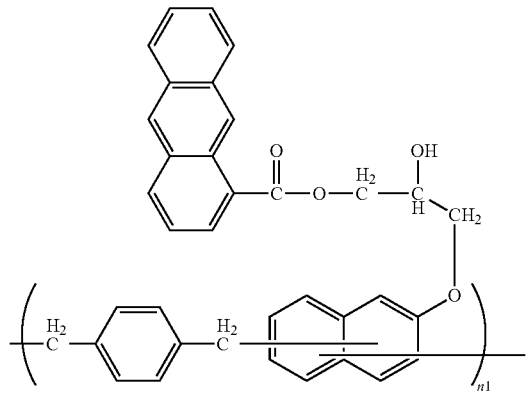

Formula (8)

A solution was obtained by adding 12.8 g of propylene glycol monomethyl ether acetate and 5.6 g of propylene glycol monomethyl ether to 1.5 g of the polyether resin of formula (8). Thereafter, the solution was filtered through a polyethylene microfilter having a pore size of 0.10 μm and further through a polyethylene microfilter having a pore size of 0.05 μm, and thus, a resist underlayer film-forming composition solution was prepared.

(Measurement of Optical Parameter)

Silicon wafers were coated with the resist underlayer film-forming composition solutions prepared in Examples 1 to 4 and Comparative Example 1 respectively using a spin coater. The resultant was baked on a hot plate at 240° C. for 1 minute and at 400° C. for 2 minutes to form a resist underlayer film (having a film thickness of 0.05 μm). The thus obtained resist underlayer film was measured, using a spectroscopic ellipsometer, for a refractive index (an n value) and an optical absorption coefficient (a k value, also designated as an extinction coefficient) at a wavelength of 193 nm. Results are shown in Table 1.

TABLE 1

| Refractive Index n and Optical Absorption Coefficient k | | | |
|---|---|---|---|
| | | n (193 nm) | k |
| Example 1 | Film baked at 240° C. | 1.45 | 0.85 |
| Example 1 | Film baked at 400° C. | 1.45 | 0.57 |
| Example 2 | Film baked at 240° C. | 1.44 | 0.57 |
| Example 2 | Film baked at 400° C. | 1.42 | 0.46 |
| Example 3 | Film baked at 240° C. | 1.41 | 0.56 |
| Example 3 | Film baked at 400° C. | 1.41 | 0.52 |
| Example 4 | Film baked at 240° C. | 1.43 | 0.57 |
| Example 4 | Film baked at 400° C. | 1.42 | 0.52 |
| Comparative Example 1 | Film baked at 240° C. | 1.52 | 0.55 |

(Test of Elution into Photoresist Solvent)

Silicon wafers were coated with the resist underlayer film-forming composition solutions prepared in Examples 1 to 4 and Comparative Example 1 respectively using a spin coater. The resultant was baked on a hot plate at 400° C. for 1 minute to form a resist underlayer film (having a film thickness of 0.20 μm). The thus obtained resist underlayer film was subjected to an immersion test in solvents used for a resist, such as ethyl lactate, propylene glycol monomethyl ether, propylene glycol monomethyl ether acetate and cyclohexanone.

It was confirmed that the film obtained by baking the solution of each of Examples 1 to 4 at 400° C. for 1 minute was insoluble in these solvents.

Although a film obtained by baking the solution of Comparative Example 1 at 240° C. for 1 minute was insoluble in the solvents, a film obtained by baking at 400° C. for 1 minute was soluble in the solvents, and solvent resistance could not be obtained.

(Evaluation of Step Coatability)

Stepped substrates were coated with the resist underlayer film-forming composition solutions prepared in Examples 1 to 4 and Comparative Example 1 respectively using a spinner. The stepped substrates (manufactured by Advantech Co., Ltd.) used were each a substrate having a step height of 400 nm and an L/S (line-and-space) of 120 nm/120 nm, and covered with a silicon oxide film. Thereafter, a cross-section of a sample obtained by baking the resultant at 240° C. and 350° C. for 60 seconds was observed with a scanning electron microscope (SEM). Results are shown in Table 2. A film thickness (nm) on the L/S and a film thickness (nm) in an area where no L/S was provided (OPEN) were measured to determine a magnitude of a film thickness difference.

TABLE 2

Evaluation Results of Step Coatability

|  |  | Film Thickness (L/S) | Film Thickness (OPEN) | Film Thickness Difference |
|---|---|---|---|---|
| Example 1 | Film after Baking at 240° C. | 47 | 112 | 65 |
| Example 1 | Film after Baking at 350° C. | 80 | 160 | 80 |
| Example 2 | Film after Baking at 240° C. | 71 | 133 | 62 |
| Example 2 | Film after Baking at 350° C. | 58 | 183 | 125 |
| Example 3 | Film after Baking at 240° C. | 0 | 327 | 327 |
| Example 3 | Film after Baking at 350° C. | 119 | 215 | 96 |
| Example 4 | Film after Baking at 240° C. | 53 | 183 | 130 |
| Example 4 | Film after Baking at 350° C. | 83 | 190 | 107 |
| Comparative Example 1 | Film after Baking at 240° C. | — | — | — |

Comparative Example 1 was poor in a property of forming a film on a stepped substrate with a large width, and a film could not be formed on the L/S and in the area OPEN on the stepped substrate.

(Evaluation of Step Coatability)

Stepped substrates were coated with the resist underlayer film-forming composition solutions prepared in Examples 1 to 4 and Comparative Example 1 respectively using a spinner. The stepped substrates (manufactured by Advantech Co., Ltd.) used were each a substrate having a step height of 400 nm and an L/S (line-and-space) of 120 nm/120 nm, and covered with a silicon oxide film. Thereafter, a cross-section of a sample obtained by baking the resultant at 240° C., 350° C. and 400° C. for 60 seconds was observed with a scanning electron microscope (SEM). Results are shown in Table 3. A sample covered without a void was defined as good, and a sample having a void was defined as poor.

TABLE 3

Evaluation Results of Step Coatability

| Example 1 | Film after Baking at 240° C. | Good |
| Example 1 | Film after Baking at 350° C. | Good |
| Example 1 | Film after Baking at 400° C. | Good |
| Example 2 | Film after Baking at 240° C. | Good |
| Example 2 | Film after Baking at 350° C. | Good |
| Example 2 | Film after Baking at 400° C. | Good |
| Example 3 | Film after Baking at 240° C. | Good |
| Example 3 | Film after Baking at 350° C. | Good |
| Example 3 | Film after Baking at 400° C. | Good |
| Example 4 | Film after Baking at 240° C. | Good |
| Example 4 | Film after Baking at 350° C. | Good |
| Example 4 | Film after Baking at 400° C. | Good |
| Comparative Example 1 | Film after Baking at 240° C. | Good |

(Evaluation of Thermophysical Property of Polymer)

Silicon wafers were coated with the resist underlayer film-forming composition solutions prepared in Examples 1 to 4 and Comparative Example 1 respectively using a spin coater. The resultant was baked on a hot plate at 100° C. for 1 minute to form a resist underlayer film (having a film thickness of 0.20 μm). The thus obtained resist underlayer film was measured for a 5% mass loss temperature ($Td_{5\%}$(° C.)). Results are shown in Table 4.

TABLE 4

Evaluation of Thermophysical Property of Polymer

|  | 5% Mass Loss Temperature $Td_{5\%}$ (° C.) |
|---|---|
| Example 1 | 406 |
| Example 2 | 219 |
| Example 3 | 300 |
| Example 4 | 343 |
| Comparative Example 1 | 315 |

The resist underlayer film obtained from the resist underlayer film-forming composition comprising the polymer containing the unit structure of formula (1) had a 5% mass loss temperature of about 220 to 410° C., and had high heat resistance. In addition, the resist underlayer film was good in the step coatability, and had a film thickness difference between a stepped portion and a portion having no step of about 60 to 330 nm. In particular, the resist underlayer film obtained from the resist underlayer film-forming composition comprising the polymer containing the unit structure of formula (2) had a small film thickness difference, was good in the step coatability and exhibited an even coating shape.

INDUSTRIAL APPLICABILITY

The present invention can provide a resist underlayer film for lithography that does not undergo intermixing with a resist layer, has high dry etching resistance, has high heat resistance, exhibits low mass loss at a high temperature, and exhibits even coatability of a stepped substrate, and a resist underlayer film-forming composition to be used for forming the resist underlayer film.

The invention claimed is:

1. A resist underlayer film, comprising a polymer containing a unit structure of the following formula (1):

Formula (1)

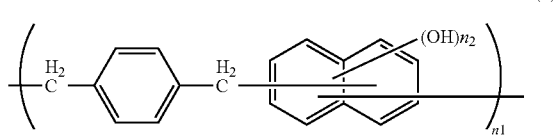

wherein n1 is the number of repetitions of the unit structure and is an integer of 1 to 10, and n2 is an integer of 1 or 2, and wherein the resist underlayer film has a 5% mass loss temperature of 220 to 410° C., and has a film thickness difference between a stepped portion and a portion having no step of 60 to 330 nm when coated onto a stepped substrate having a step height of 400 nm and a line-and-space of 120 nm/120 nm.

2. The resist underlayer film according to claim 1, wherein the unit structure of formula (1) is a unit structure of the following formula (2):

Formula (2)

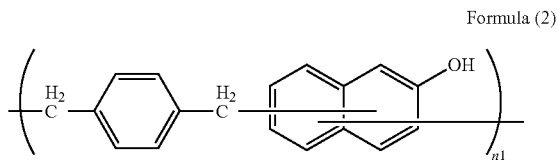

wherein n1 is the number of repetitions of the unit structure and is an integer of 1 to 10.

3. The resist underlayer film according to claim 1, further comprising a crosslinking agent.

4. The resist underlayer film according to claim 1, further comprising an acid and/or an acid generator.

5. A method for producing the resist underlayer film according to claim 1, comprising coating a semiconductor substrate with a resist underlayer film-forming composition, and baking to form the resist underlayer film.

6. A method for producing a semiconductor device, comprising a step of forming, on a semiconductor substrate, the resist underlayer film according to claim 1 comprising a resist underlayer film-forming composition, a step of forming a resist film on the resist underlayer film, a step of forming a resist pattern by irradiation with light or an electron beam and development of the resist film, a step of etching the resist underlayer film using the resist pattern, and a step of processing the semiconductor substrate using the patterned resist underlayer film.

7. A method for producing a semiconductor device, comprising a step of forming, on a semiconductor substrate, the resist underlayer film according to claim 1 comprising a resist underlayer film-forming composition, a step of forming a hard mask on the resist underlayer film, a step of forming a resist film on the hard mask, a step of forming a resist pattern by irradiation with light or an electron beam and development of the resist film, a step of etching the hard mask using the resist pattern, a step of etching the resist underlayer film using the patterned hard mask, and a step of processing the semiconductor substrate using the patterned resist underlayer film.

8. The production method according to claim 6, wherein the processing of the semiconductor substrate is etching of the semiconductor substrate or ion implantation into the semiconductor substrate.

9. The production method according to claim 6, wherein the processing of the semiconductor substrate is ion implantation of a component containing boron, arsenic, phosphorus or a combination thereof into the semiconductor substrate.

10. The resist underlayer film according to claim 1, wherein the polymer consists of the unit structure of the formula (1).

* * * * *